United States Patent
Ito et al.

(10) Patent No.: US 7,659,039 B2
(45) Date of Patent: Feb. 9, 2010

(54) NEAR-FIELD EXPOSURE MASK, METHOD OF PRODUCING THAT MASK, NEAR-FIELD EXPOSURE APPARATUS HAVING THAT MASK, AND RESIST PATTERN FORMING METHOD

(75) Inventors: Toshiki Ito, Kawasaki (JP); Natsuhiko Mizutani, Tokyo (JP); Takako Yamaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/585,644

(22) PCT Filed: Jun. 7, 2006

(86) PCT No.: PCT/JP2006/311887

§ 371 (c)(1),
(2), (4) Date: Apr. 6, 2009

(87) PCT Pub. No.: WO2006/132425

PCT Pub. Date: Dec. 14, 2006

(65) Prior Publication Data

US 2009/0208850 A1 Aug. 20, 2009

(30) Foreign Application Priority Data

Jun. 8, 2005 (JP) .............................. 2005-167899

(51) Int. Cl.
*G03F 1/00* (2006.01)
(52) U.S. Cl. .......................................... 430/5; 430/322
(58) Field of Classification Search ...................... 430/5, 430/311, 312, 313, 322, 323, 324, 394
See application file for complete search history.

(56) References Cited

U.S. PATENT DOCUMENTS

| 6,171,730 B1 | 1/2001 | Kuroda et al. |
| 7,022,463 B2 | 4/2006 | Yamaguchi et al. |
| 7,419,763 B2 | 9/2008 | Yamaguchi et al. |
| 2004/0137338 A1 | 7/2004 | Inao et al. |

(Continued)

FOREIGN PATENT DOCUMENTS

JP 2-269343 A 11/1990

(Continued)

OTHER PUBLICATIONS

U.S. Appl. No. 11/913,922, International Filing Date Oct. 10, 2007, Ito.

(Continued)

*Primary Examiner*—Stephen Rosasco
(74) *Attorney, Agent, or Firm*—Fitzpatrick, Cella, Harper & Scinto

(57) ABSTRACT

Disclosed is a near-field exposure mask having a light blocking layer formed on a substrate, the light blocking layer having an opening with an opening width narrower than a wavelength of an exposure light source, wherein exposure of an object to be exposed is carried out by use of near-field light to be produced at the opening while the exposure mask and the object to be exposed are placed in contact with each other, an important feature residing in that the light blocking layer is provided by a film that contains silicon in a range from 50% to 100% in terms of mole fraction.

11 Claims, 4 Drawing Sheets

U.S. PATENT DOCUMENTS

| | | |
|---|---|---|
| 2007/0212806 A1 | 9/2007 | Ito |
| 2007/0218373 A1 | 9/2007 | Ito et al. |
| 2007/0218398 A1 | 9/2007 | Ito et al. |
| 2008/0085479 A1 | 4/2008 | Yamaguchi et al. |
| 2008/0187864 A1 | 8/2008 | Ito et al. |
| 2008/0187865 A1 | 8/2008 | Ito et al. |

FOREIGN PATENT DOCUMENTS

| | | |
|---|---|---|
| JP | 6-95358 | 4/1994 |
| JP | 6-95363 | 4/1994 |
| JP | 11-145051 A | 5/1999 |
| JP | 2004-111500 A | 4/2004 |
| JP | 2004-185737 A | 7/2004 |
| WO | 89/03544 | 4/1989 |

OTHER PUBLICATIONS

U.S. Appl. No. 12/376,426, International Filing Date Oct. 5, 2007, Ito, et al.

PCT International Search Report dated Oct. 11, 2006 in International Application No. PCT/JP2006/311887.

McNAB, et al., "Effects of Mask Materials on Near Field Optical Nanolithography", Mat. Res. Soc. Symp. Proc., vol. 705, 2002, pp. 107-112.

Paulus, et al., "Contrast mechanisms in high-resolution contact lithography: A comparative study", Microelectronic Engineering, vol. 57-58, 2001, pp. 109-116.

Resnick, et al, "Release Layers for Contact and Imprint Lithography", Semiconductor International, 2002, www.semiconductor.net.

Official Action dated May 7, 2008 in Japanese Application No. 2006-158637.

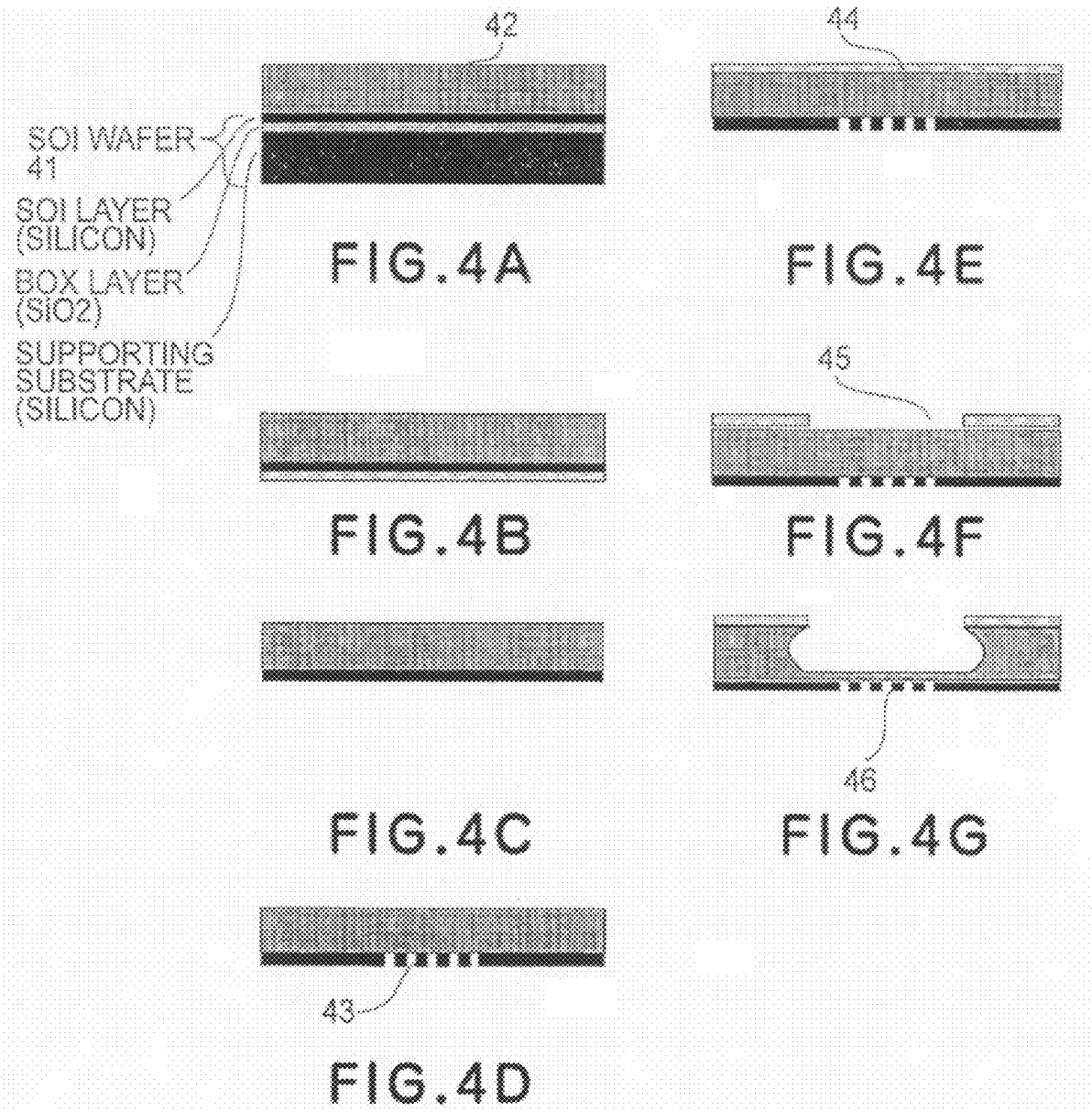

NEAR-FIELD EXPOSURE MASK, METHOD OF PRODUCING THAT MASK, NEAR-FIELD EXPOSURE APPARATUS HAVING THAT MASK, AND RESIST PATTERN FORMING METHOD

TECHNICAL FIELD

This invention relates to a near-field exposure mask, a method of producing that mask, a near-field exposure apparatus having that mask, and a resist pattern forming apparatus.

BACKGROUND ART

In the fields of various electronic devices such as semiconductor devices, for example, which need microprocessing procedures, because of requirements for further enlargement of device density and integration, the pattern size has to be miniaturized more and more. One of the semiconductor manufacturing processes which plays an important role for formation of an extraordinarily fine pattern is a photolithographic process.

Most of current photolithographic processes are currently carried out on the basis of reduction projection exposure. The resolution thereof is restricted by diffraction limits of light, and generally a spatial resolution of only about one-third of the wavelength of a light source is obtainable. In consideration of this, the wavelength for exposure has been shortened such as, for example, by using a KrF excimer laser or an ArF excimer laser as an exposure light source. As a result of this, microprocessing of about 100 nm order has currently been enabled.

Along with the introduction of shorter wavelengths, various modifications have been attempted in relation to photomasks, for example, used there because the light intercepting property is insufficient where conventional masks are used.

An example is found in Japanese Laid-Open Patent Application, Publication No. H06-095363 and Japanese Laid-Open Patent Application, Publication No. H06-095358, wherein a photomask having a light blocking film made of silicon is proposed, for, with a conventional chromium-based photomask, the light intercepting property with respect to KrF excimer lasers (wavelength 248 nm) is insufficient.

However, the photomasks disclosed in these patent documents are anyway those masks to be used in the reduction projection exposure process.

In the photolithography wherein the wavelength of used light sources has been shortened more and more as described above, in addition to the matter of photomasks, there are many problems such as bulkiness of apparatus, development of lenses usable in shortened wavelengths, cost of apparatus, cost of usable resist materials, and so on.

On the other hand, as another attempt to enabling optical microprocessing with a resolution finer than the wavelength of light, a method that uses near-field light has been proposed.

Such near-field optical lithography is free from the restriction due to the diffraction limits of light, and thus a spatial resolution of one-third or less of the light source wavelength is attainable. Another advantage is that, if a mercury lamp or a semiconductor laser is used as an exposure light source, the exposure light source can be made very small and therefore the apparatus can be made very compact and yet the cost of the apparatus can be made lower.

U.S. Pat. No. 6,171,730 shows an example of lithography using near-field light.

This patent document discloses a method in which a near-field exposure mask provided with a light blocking film having openings narrower than the light source wavelength is closely contacted to a resist with a small clearance less than 100 nm (i.e. near field region), and a fine pattern formed on the mask is transferred to the resist by one-shot exposure.

In the aforementioned U.S. Pat. No. 6,171,730 wherein the exposure is carried out while the near-field exposure mask is closely contacted to the resist, a portion of near-field light produced at the openings of the light blocking layer would be transformed into propagating light. Even if the incident light is being perpendicularly incident on the light blocking layer, since the propagating light produced by transformation from the near-field light has low directivity, it would be propagated in oblique directions. This propagating light is propagated through the object material to be exposed, while it is reflected by the substrate surface and then by the light blocking layer (i.e. multiple reflection). As a result of propagation of light through the object material to be exposed while being reflected repeatedly, it is possible that the propagating light reaches an adjacent pattern area to adversely affect the quality of the pattern. Furthermore, depending on a resist used, the adhesion to the light blocking layer of the mask may be strong so that the mask may be broken upon removal thereof or the resist may be peeled off from the substrate.

Additionally, if a used resist material is of the type that development contrast is produced by reaction that uses, as a catalyst, acid being produced by the exposure, such as, for example, a chemical amplification type resist or an optical cationic polymerization type resist, the light blocking layer of the mask would be corroded by the produced acid and hence the lifetime of the mask would become shorter.

DISCLOSURE OF THE INVENTION

It is accordingly an object of the present invention to provide a near-field exposure mask and a method of producing the same by which at least one of the inconveniences described hereinbefore can be removed or reduced.

It is another object of the present invention to provide a near-field exposure apparatus, a resist pattern forming method, and a device manufacturing method that use a near-field exposure mask such as above.

In accordance with an aspect of the present invention, there is provided a near-field exposure mask having a light blocking layer formed on a substrate, the light blocking layer having an opening with an opening width narrower than a wavelength of an exposure light source, wherein exposure of an object to be exposed is carried out by use of near-field light to be produced at the opening while the exposure mask and the object to be exposed are placed in contact with each other, and wherein the light blocking layer is provided by a film that contains silicon in a range from 50% to 100% in terms of mole fraction.

In accordance with another aspect of the present invention, there is provided a method of producing a near-field exposure mask to be used in a process wherein an exposure is carried out by use of near-field light while the exposure mask and an object to be exposed are placed in contact with each other, the method including a step of forming, on a substrate, a light blocking film by use of a film that contains silicon in a range from 50% to 100% in terms of mole fraction, and a step of forming, in the light blocking film, an opening with an opening width narrower than a wavelength of an exposure light source.

Near-field exposure apparatuses, resist pattern forming methods and device manufacturing methods as well are within the scope of the present invention.

Thus, in accordance with a further aspect of the present invention, there is provided a near-field exposure apparatus having a near-field exposure mask with a light blocking layer and means for contacting the light blocking layer of the mask with an object to be exposed, wherein light is projected from a side remote from the light blocking layer of the exposure mask such that closed-contact exposure of the exposure object is carried out by use of near-field light produced at the exposure object side, and wherein the exposure mask is constituted by a near-field exposure mask as recited just above.

In accordance with a yet further aspect of the present invention, there is provided a resist pattern forming method in which a near-field exposure mask is used and an exposure is carried out while the mask is placed in contact with a resist, thereby to produce a pattern in the resist, wherein the exposure mask is constituted by a near-field exposure mask as recited just above.

In accordance with a still further aspect of the present invention, there is provided a device manufacturing method for producing a device by use of a substrate for device manufacture, the method including: a step of applying a photosensitive resist to the substrate; a step of bringing the resist and a near-field exposure mask as recited just above into contact with each other; a step of irradiating the resist with light from an exposure light source through the near-field exposure mask; a step of developing the resist after being irradiated with the light; and a step of etching the substrate on the basis of the resist after being developed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A through 4G are schematic views, respectively, for explaining processes for producing a near-field exposure mask according to a fourth example of the present invention.

BEST MODE FOR PRACTICING THE INVENTION

Figure 1A:
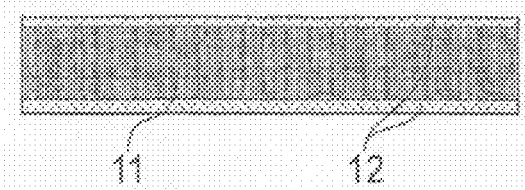
FIGS. 1A through 1E are schematic views, respectively, for explaining processes for producing a near-field exposure mask according to a first example of the present invention.

Briefly, a near-field exposure mask according to the present invention has a light blocking layer formed on a substrate, the light blocking layer having an opening with an opening width narrower than a wavelength of an exposure light source, wherein exposure of an object to be exposed is carried out by use of near-field light to be produced at the opening while the exposure mask and the object to be exposed are placed in contact with each other. Here, the light blocking layer is provided by a film that contains silicon in a range from 50% to 100% in terms of mole fraction.

In accordance with this feature of the present invention, multiple reflection of light between the light blocking layer and the object to be exposed can be reduced. Furthermore, after the contact exposure, the exposure mask can be easily separated from the resist. Hence, the present invention does provide a near-field exposure mask having good durability to corrosion by acid produced in the resist.

In the aforementioned Japanese Laid-Open Patent Applications, Publication Nos. H06-095363 and H06-095358, a light blocking film of silicon is used in a photomask for photolithography for conventional reduction projection exposure process. However, basically this is done to compensate for insufficiency of light intercepting property of conventional chromium-based photomask caused by shortening of the wavelength of the exposure light source, such as KrF excimer laser (wavelength 248 nm).

To the contrary, the inventors of the subject application carried out exhaustive investigations concerning inconveniences of multiple reflection and mask separation from the resist as well as inconveniences of mask corrosion due to the acid produced in the resist, all being peculiar to the near-field exposure, and the present invention has been accomplished on the basis of the finding obtained through the investigations.

The present invention can be embodied in many varieties of forms; examples are as follows.

In the near-field exposure mask of the present invention, the light blocking layer may be constituted by amorphous silicon, polycrystal silicon, or monocrystal silicon. The light blocking layer may have a transmittance (transmissivity) of 0.1 or less with respect to the wavelength of an exposure light source.

The light blocking layer may have a silicon-containing film with a surface having been water-repellent or oil-repellent finished.

In the water-repellent or oil-repellent finishing process, a fluorine-based silane coupling agent may be deposited on the surface of the silicon containing film.

The fluorine-based silane coupling agent may be provided by a compound that can be represented by a general equation $Rf_m R_n SiX_{x-m-m}$ wherein Rf is alkyl group with hydrogen being partially or entirely fluorine-substituted, R is alkyl group, Si is silicon, X is one of alkoxyl group, halogen group and amino group with conditions $1 \leq m \leq 3$, $0 \leq n \leq 2$ and $1 \leq m+n \leq 3$.

In the water-repellent or oil-repellent finish process, a halogen-element containing gas may be exposed to plasma by which the surface of the silicon containing film may be halogenated.

A near-field exposure mask producing method according to the present invention may be: a method of producing a near-field exposure mask to be used in a process wherein an exposure is carried out by use of near-field light while the exposure mask and an object to be exposed are placed in contact with each other, characterized by: a step of forming, on a substrate, a light blocking film by use of a film that contains silicon in a range from 50% to 100% in terms of mole fraction; and a step of forming, in the light blocking film, an opening with an opening width narrower than a wavelength of an exposure light source. The method may further include a step of partially removing the substrate from a side thereof remote from the light blocking layer formed on the substrate, to produce a thin film portion for receiving light from the light source side.

The method may further include a step of water-repellent finishing or oil-repellent finishing the surface of the light blocking layer having openings.

The light blocking layer forming step may include a process of thickness-reducing a silicon containing light blocking layer bonded to the substrate and having a predetermined thickness, to provide a thin film that may function as the light blocking layer.

In a resist pattern forming method according to the present invention, as the resist, a resist in which development contrast is produced through reaction using, as a catalyst, acid produced by the contact exposure may be used.

Here, the resist may be a chemical amplification type resist or an optical cationic polymerization type resist.

Next, the present invention will be explained with reference to some specific examples. It should be noted here that the followings are mere examples and that the present invention is not limited to these examples.

EXAMPLE 1

In Example 1, the present invention was applied and a mask was prepared in accordance with a near-field exposure mask producing method such as follows.

FIGS. 1A through 1E show the processes according to the near-field exposure mask producing method of this embodiment.

Now, referring to FIGS. 1A-1E, the near-field exposure mask producing sequential processes will be explained.

First of all, a silicon substrate 11 is prepared, and films of silicon nitride $Si_3N_4$ are formed on both sides of the substrate through a reduced CVD process, to provide there mask transparent base materials 12 (FIG. 1A), the base materials then functioning as an elastically (resiliently) deformable thin film. Here, it should be noted that the substrate and the base material are not limited to those disclosed above.

Figure 1B:
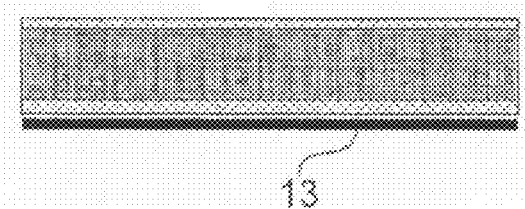

Subsequently, a silicon thin film is formed on one side of the silicon substrate 11, to provide there a silicon light blocking layer 13 (FIG. 1B).

Here, the thickness and/or the attenuation (extinction) coefficient of the silicon light blocking layer 13 may preferably be adjusted so that the light blocking layer has a transmittance not greater than 0.1, more preferably, not greater than 0.01 with respect to the exposure wavelength. If the transmittance is larger than 0.1, the light intensity contrast between an exposed portion and an unexposed portion will be low, and a resist pattern having good resolution would be unattainable. The attenuation coefficient can be adjusted by the film forming condition or by the addition of metal (to be described later).

The transmittance T of the light blocking layer having an attenuation coefficient k and a thickness t with respect to the exposure wavelength λ can be calculated in accordance with the following equation:

$$T=\exp(-4\pi kt/\lambda)$$

As an example, the transmittance λ of a light blocking layer having a thickness 50 nm with respect to the exposure wavelength 356 nm is not greater than 0.1 for an attenuation coefficient k=1.338 or more, and not greater than 0.01 for an attenuation coefficient k=2.675 or more. Amorphous silicon, polycrystal silicon and monocrystal silicon have an attenuation coefficient of about 2.6 to 2.8 with respect to the exposure wavelength 365 nm.

Here, as regards the thickness of the light blocking layer 13 that contains silicon, it may be 10 to 100 nm, for example. As regards the thickness of the transparent base material 12, preferably it may be 0.1 to 100 μm.

The silicon light blocking layer 13 may contain metal, for example. In that occasion, by changing the composition ratio, the attenuation coefficient of the light blocking layer can be changed as desired. As regards the content ratio of silicon (atoms) of the film that constitutes the light blocking layer used in the mask of the present invention, it is within a range from not less than 50% to not greater than 100% in terms of mole fraction and, more preferably, not less than 90% and not greater than 100%. Where the content ratio is less than 50%, the machining of the light blocking film becomes difficult to do. With regard to the silicon light blocking layer 13 forming method, it may be a sputtering method or a reduced-pressure chemical vapor deposition (CVD) method, for example.

If the silicon obtained is amorphous, an annealing process based on heat or laser may be performed to crystallize the same. Use of crystalline silicon is preferable in this embodiment from the standpoint of patterning, which will be described later.

Figure 1C:
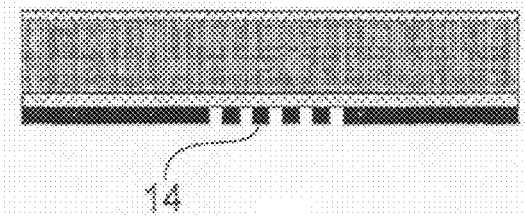

Subsequently, a fine pattern 14 is formed on the silicon light blocking layer 13 (FIG. 1C). The fine pattern 14 can be patterned there by means of a direct patterning process using a focused ion beam (FIB) patterning machine or through an etching process in which a resist having been patterned by use of an electron beam (EB) patterning machine is used as a mask. In this embodiment, the fine pattern 14 has an opening width which is made narrower than the wavelength of the exposure light source to be used in the near-field exposure process.

In the etching process using an EB patterning machine, an electron-beam resist may be directly applied to the silicon light blocking layer 13 surface or, alternatively, an intermediate layer such as an oxide layer (e.g. $SiO_2$ or $TiO_2$) or a metal layer (e.g. Cr, Ti, Au or Al) may be previously formed on the silicon light blocking layer 13 and subsequently an electron-beam resist may be applied thereto.

As regards the etching process for the silicon layer and/or the intermediate layer, it may be either a dry etching process or a wet etching process. For the dry etching, a gas of $CF_4$, $C_2F_6$, $C_3F_8$, $CCl_2F_2$, $CCl_4$, $CBrF_3$, $BCl_3$, $PCl_3$, $SF_6$, $Cl_2$, HCl or HBr may be used, for example. For the wet etching, an alkaline aqueous solution such as potassium hydroxide or tetramethylammonium hydroxide, for example, may be used.

Where crystalline silicon is wet-etched, a fine pattern (14) along the crystal axis having good anisotropy can be produced.

Here, there is a possibility that, when a near-field exposure mask is closely contacted to the resist and the exposure is carried out, although it depends on the condition, the mask is tightly adhered to the resist such that, after the exposure, the mask cannot easily be separated from the resist. In order to avoid such inconvenience and to facilitate mask separation after exposure, a water-repellent and/or oil-repellent finishing process may be carried out to the silicon light blocking layer 13 on which the fine pattern 14 is formed.

The water-repellent or oil-repellent layer formed thereby on the silicon surface is dense and has good chemical bonding force with silicon. Therefore, the water-repellent or oil-repellent effect lasts very long. As a result of this, through the influence of the water-repellent or oil-repellent finishing, the durability of the near-field exposure mask is improved.

The water-repellent or oil-repellent finishing process may be carried out by use of a fluorine-based silane coupling agent.

In that occasion, first of all, under a liquid-phase or gaseous-phase condition, a fluorine-based silane coupling agent may be deposited on the silicon light blocking layer 13.

The deposition under liquid-phase condition may be carried out by dipping the mask substrate within an aqueous solution that contains a fluorine-based silane coupling agent for a few minutes to tens minutes.

The deposition under gaseous-phase condition may be carried out by placing the mask substrate within a vapor ambience of a fluorine-based silane coupling agent for a few minutes or tens minutes.

The fluorine-based silane coupling agent may preferably be provided by a compound that can be represented by a general equation $Rf_mR_nSiX_{x-m-m}$, wherein Rf is alkyl group with hydrogen being partially or entirely fluorine-substituted, R is alkyl group, Si is silicon, X is one of alkoxyl group, halogen group and amino group with conditions $1 \leq m \leq 3$, $0 \leq n \leq 2$ and $1 \leq m+n \leq 3$.

After the fluorine-based silane coupling agent is deposited, the mask substrate is placed within an environment having a temperature 20-60° C. and a humidity 40-100%, for more than 1 hour. With this procedure, a condensation reaction occurs between the hydroxyl group of the natural oxidation film upon the silicon light blocking layer 13 and the alkoxyl group or the halogen group of the fluorine-based silane coupling agent.

After that, the mask substrate is dipped in an organic aqueous solution for a few minutes, to remove any non-reacted excess fluorine-based silane coupling agent therefrom.

As an alternative to the water-repellent or oil-repellent finishing of the silicon light blocking layer 13, the layer surface may be halogenated by exposing the same to plasma that contains halogen atoms such as fluorine, chlorine or bromine, for example.

To this end, the mask substrate may be placed inside a vacuum chamber of a dry etching machine and exposed to plasma of $CF_4$, $C_2F_6$, $C_3F_8$, $CCl_2F_2$, $CCl_4$, $CBrF_3$, $BCl_3$, $PCl_3$, $SF_6$, $Cl_2$, HCl or HBr, for example, by which the surface of the light blocking layer silicon can be halogenated.

Figure 1D:
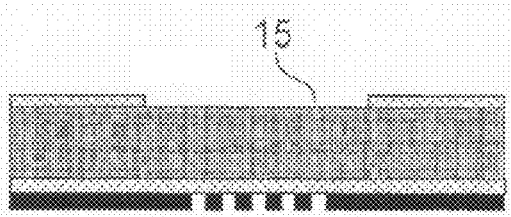

Subsequently, a back-etching hole 15 is patterned on the transparent base material 12 which is at the other side of the silicon substrate 11, that is, at the back side of the mask (FIG. 1D).

The patterning of this back-etching hole 15 may be carried out by an etching process using a resist pattern as a mask, the resist pattern being provided through a resist applying process, a resist exposure process and a resist development process.

Figure 1E:
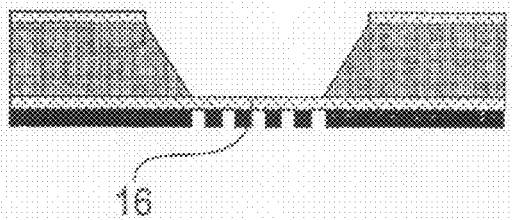

After that, crystal-axis anisotropic etching of the silicon substrate 11 may be carried out by using an alkaline aqueous solution such as potassium hydroxide or tetramethylammonium hydroxide (TMAH), for example, whereby a thin-film mask structure having a mask thin-film portion 16 is accomplished (FIG. 1E).

It should be noted here that in this embodiment a SOI wafer with a transparent base material provided only at the supporting substrate side may be used and the structure similar to that shown in FIG. 1B may be produced. In that occasion, the procedure after formation of the fine pattern 14 may be the same.

EXAMPLE 2

In Example 2, the present invention was applied and a mask was prepared in accordance with a near-field exposure mask producing method different from Example 1.

FIGS. 2A through 2E show the processes according to the near-field exposure mask producing method of this embodiment.

Now, referring to FIGS. 2A-2E, the near-field exposure mask producing sequential processes will be explained.

Figure 2A:
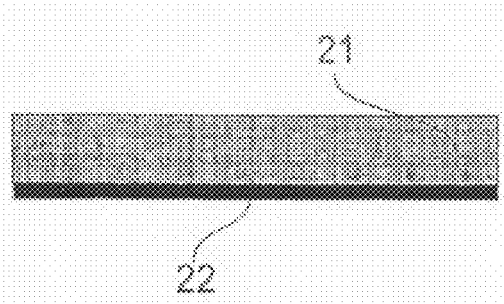
FIGS. 2A through 2E are schematic views, respectively, for explaining processes for producing a near-field exposure mask according to a second example of the present invention.

First of all, a transparent substrate 21 is prepared, and a silicon light blocking layer 22 is produced thereon in a similar way as Example 1 (FIG. 2A). Subsequently, a fine pattern 23 is formed on the silicon light blocking layer 22 (FIG. 2B). The patterning of the fine pattern 23 may be carried out in a similar manner as Example 1.

Here, water-repellent and/or oil-repellent finishing process may preferably be carried out to the silicon light blocking layer 22 having a fine pattern 23 formed thereon. The water-repellent or oil-repellent finish may be carried out in a similar way as Example 1.

Figure 2D:
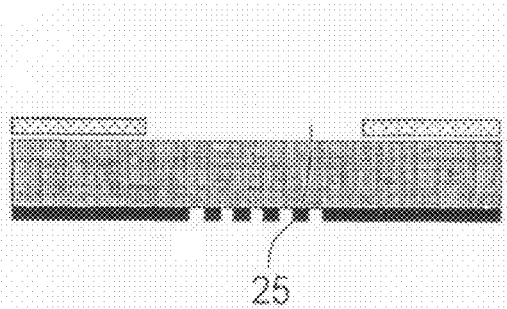
Figure 2B:
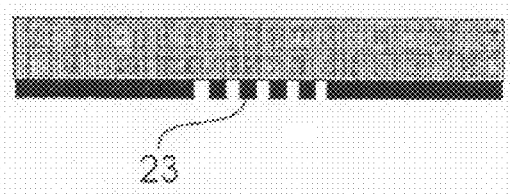
Figure 2E:
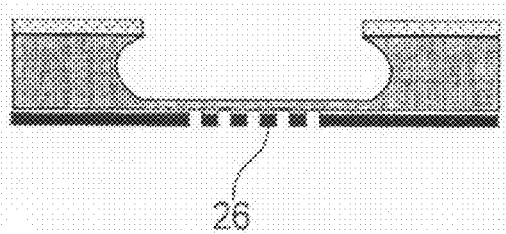
Figure 2C:
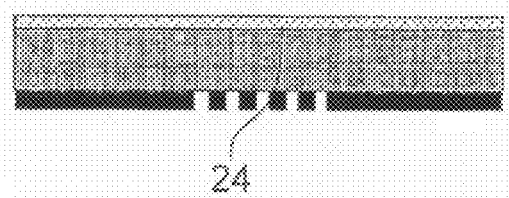

Subsequently, a resist 24 is applied to the other side of the transparent substrate 21 where no silicon light blocking layer is provided (FIG. 2C).

After that, exposure and development processes are carried out, by which a back-etching hole 25 is produced (FIG. 2D). Thereafter, the transparent substrate 21 is etched by using hydrofluoric-acid aqueous solution, for example. This etching process may be completed so that a material of the transparent substrate 21 having a thickness of 0.1 to 100 μm remains there. With this procedure, a thin-film mask structure having a resiliently deformable mask thin-film portion 26 can be accomplished (FIG. 2E).

In accordance with a near-field exposure mask produced in this manner, the mask thin-film portion 26 and the transparent substrate 21 are made from the same substrate. As a result of this, in the near-field exposure mask produced in this embodiment, no sagging easily occurs at the mask thin-film portion 26.

EXAMPLE 3

In Example 3, the present invention was applied and a mask was prepared in accordance with a near-field exposure mask producing method different from Examples 1 and 2.

FIGS. 3A through 3F show the processes according to the near-field exposure mask producing method of this embodiment.

Now, referring to FIGS. 3A-3F, the near-field exposure mask producing sequential processes will be explained.

Figure 3A:
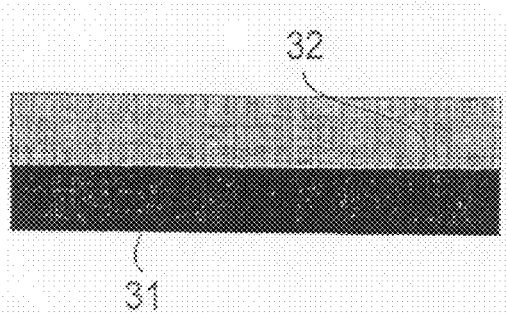
FIGS. 3A through 3F are schematic views, respectively, for explaining processes for producing a near-field exposure mask according to a third example of the present invention.

First of all, a silicon substrate 31 is prepared, and a transparent substrate 32 made of quartz, for example, is bonded to one side of the silicon substrate 31 (FIG. 3A).

Figure 3D:
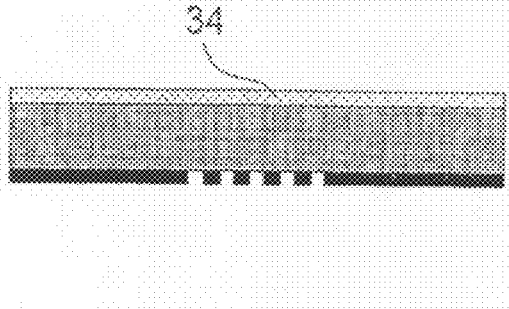
Figure 3B:

Subsequently, the silicon substrate 31 is reduced in thickness by machine polishing, CMP or dry etching, for example, into a film having a thickness of 10 to 100 nm (FIG. 3B).

Figure 3E:
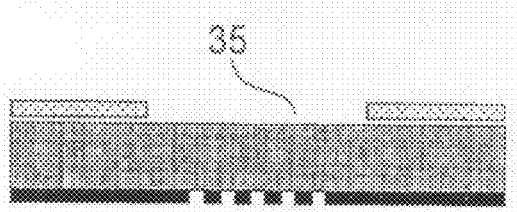
Figure 3C:
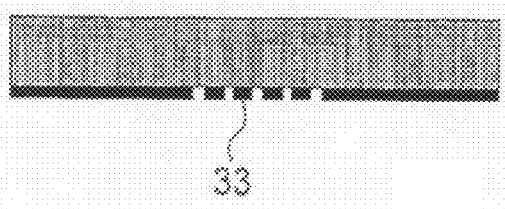

Then, a fine pattern 33 is formed on the thickness-reduced silicon substrate 31 (FIG. 3C). The patterning of the fine pattern 33 may be carried out in a similar way as Example 1.

Here, water-repellent and/or oil-repellent finishing process may preferably be carried out to the silicon substrate 31 having a fine pattern 33 formed thereon. The water-repellent or oil-repellent finish may be carried out in a similar way as Example 1.

Subsequently, a resist 34 is applied to the other side of the transparent substrate 32 where the fine pattern 33 is not formed (FIG. 3D).

Figure 3F:
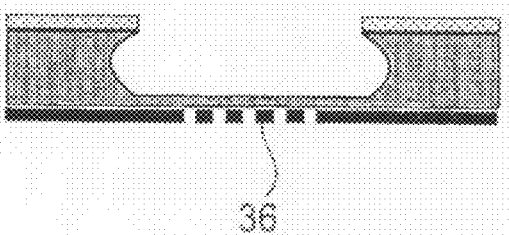

After that, exposure and development processes are carried out, by which a back-etching hole 25 is produced (FIG. 3E). Thereafter, the transparent substrate 32 is etched by using hydrofluoric-acid aqueous solution, for example. This etching process may be completed so that a material of the transparent substrate 32 having a thickness of 0.1 to 100 μm remains there. With this procedure, a thin-film mask structure having a resiliently deformable mask thin-film portion 36 can be accomplished (FIG. 3F).

In accordance with a near-field exposure mask produced in this manner, like that of Example 2, the mask thin-film portion 36 and the transparent substrate 32 are made from the same substrate. As a result of this, in the near-field exposure mask produced in this embodiment, no sagging easily occurs at the mask thin-film portion 36.

EXAMPLE 4

In Example 4, the present invention was applied and a mask was prepared in accordance with a near-field exposure mask producing method different from Examples 1, 2 and 3.

FIGS. 4A through 4G show the processes according to the near-field exposure mask producing method of this embodiment.

Now, referring to FIGS. 4A-4G, the near-field exposure mask producing sequential processes will be explained.

First of all, a SOI wafer 41 is prepared, and a transparent substrate 42 made of quartz, for example, is bonded to one side of the wafer 41 (FIG. 4A).

The SOI wafer may preferably have a thickness of 10 to 100 nm. However, even if the thickness is greater than this, the thickness-reducing process for the SOI layer similar to that of Example 3 may be carried out after the process shown in FIG. 4C.

Subsequently, the supporting substrate of the SOI wafer 41 is removed by using an alkaline aqueous solution such as potassium hydroxide or tetramethylammonium hydroxide (TMAH), for example (FIG. 4B).

Subsequently, a BOX layer is removed by using a hydrofluoric-acid aqueous solution, for example (FIG. 4C).

Then, a fine pattern 43 is formed on the SOI layer (FIG. 4D). The patterning of the fine pattern 43 may be carried out in a similar way as Example 1.

Here, water-repellent and/or oil-repellent finishing process may preferably be carried out to the SOI layer of the SOI wafer 41 having a fine pattern 43 formed thereon. The water-repellent or oil-repellent finish may be carried out in a similar way as Example 1.

Subsequently, a resist 44 is applied to the other side of the transparent substrate 42 where no silicon layer is provided (FIG. 4E).

After that, exposure and development processes are carried out, by which a back-etching hole 45 is produced (FIG. 4F). Thereafter, the transparent substrate 42 is etched by using hydrofluoric-acid aqueous solution, for example. This etching process may be completed so that a material of the transparent substrate 42 having a thickness of 0.1 to 100 μm remains there. With this procedure, a thin-film mask structure having a resiliently deformable mask thin-film portion 46 can be accomplished (FIG. 4G).

In accordance with a near-field exposure mask produced in this manner, like that of Example 2, the mask thin-film portion 36 and the transparent substrate 32 are made from the same substrate. As a result of this, in the near-field exposure mask produced in this embodiment, no sagging easily occurs at the mask thin-film portion 46.

An alternative embodiment of near-field exposure mask production is that: a transparent substrate having a silicon light blocking layer with a pattern is polished to reduce the thickness thereof, at its side remote from the light blocking layer, to produce a thin-film structure and the resultant is adhered to a separate supporting member having an opening.

EXAMPLE 5

In Example 5, a near-field exposure mask prepared in accordance with the present invention was used and a resist pattern was formed in accordance with a resist pattern forming method such as follows.

As regard the resist to be used, either positive type resists or negative type resists may be used provided that they have sensitivity to the light source to be used.

Examples of positive type resist are diazo-naphthoquinon Novolak type ones and chemical amplification positive type ones. Examples of negative type resist are chemical amplification negative type ones, optical cationic polymerization type ones, optical radical polymerization type ones, polyhydroxystyrene-bisazide type ones, and cyclized rubber-bisazide type ones, polycinnamic acid vinyl type ones.

Where chemical amplification positive type resists or chemical amplification negative type resists are used, a pattern having good linewidth precision can be produced.

In chemical amplification type resists or optical cationic polymerization type resists, acid is produced by the exposure. The near-field exposure mask according to the present invention wherein silicon is used in the light blocking layer has good resistance to corrosion by acid as compared with conventional near-field exposure masks having a metal light blocking layer. Therefore, the durability is best particularly in the near-field exposure using a chemical amplification type resist or an optical cationic polymerization type resist.

The resist is applied onto a workpiece substrate (substrate for device production). The workpiece substrate can be chosen from wide varieties such as, for example, semiconductor substrates such as Si, GaAs and InP, and insulative substrates such as glass, quartz and BN, as well as those that comprises a substrate made of one of these materials and a film formed on the substrate and being made of at least one of resist, metal, oxide and nitride, for example.

Generally, the propagation depth of the near-field light is not greater than 100 nm. In consideration of this, in order to provide a resist pattern of a height not less than 100 nm through the near-field lithography, a multi-layer resist method may preferably be used. More specifically, a dual-layer resist method may preferably be used; in which method a lower-layer resist that can be removed by dry etching is applied onto a substrate and then a second resist having an oxygen-dry-etching resistance is applied onto the lower-layer resist. As an alternative, a triple-layer resist method may preferably be used; in which method a lower-layer resist layer which can be removed by dry etching is applied onto a substrate, and in which an oxygen plasma dry etching resistive layer as well as an additional resist layer are applied onto the lower-layer resist.

The resist application may be carried out by using any applying machines and methods known in the art, such as a spin coater, a dip coater or a roller coater, for example.

The film thickness can be determined comprehensively in accordance with the machining depth of the bottom substrate as well as the plasma etching resistance and the light intensity profile of the resist. Normally, it is desired to apply the resist so that a thickness of 10 to 300 nm remains after the prebaking.

Prior to the resist coating, one or more high-boiling-point solvents may be added to the resist in order to make the resist thickness after the prebaking thinner. Examples of such solvents are benzyl ethyl ether, di-n-hexyl ether, diethylene glycol monomethyl ether, diethylene glycol monoethyl ether, acetonyl acetone, isophorone, capronic acid, caprylic acid, 1-octanol, 1-nonanol, benzyl alcohol, benzyl acetate, benzonic ethyl, diethyl oxalate, diethyl maleate, Y-butyrolacton, ethylene carbonate, propylene carbonate, and ethylene glycol monophenyl ether acetate.

The coating film of resist is then prebaked at a temperature of 80-200° C., more preferably, 80-150° C. The prebaking may be done by use of heating means such as hot plate or hot air dryer, for example.

For close contact between the mask and the resist, a pressure difference is applied to between the upper surface and the lower surface of the mask thin film portion to cause elastic deformation of the thin film portion in a direction of a normal to the mask surface.

As regards the light source of near-field exposure light, it may be a known light source such as, for example, carbon arc lamp, mercury vapor arc lamp, high pressure Hg lamp, xenon lamp, YAG laser, Ar ion laser, semiconductor laser, F2 excimer laser, ArF excimer laser, KrF excimer laser, visible light, etc. A single light source may be used, or plural light sources may be used in combination. In the present invention, light of a wavelength shorter than 365 nm may particularly preferably used, for silicon has large attenuation coefficient with respect to wavelengths shorter than 365 nm.

As compared with metal which is conventionally used in a light blocking layer, silicon has a low reflectance at the resist/light-blocking-layer interface. As a result of this, multiple reflection of propagating light which is produced by transformation from near-field light is reduced more and, therefore, each pattern group has considerably high isolatedness.

With the use of the near-field exposure mask having a water-repellent or oil-repellent finished silicon light blocking layer 3 as described hereinbefore, after the near-field exposure, there does not occur breakage of the mark or peel-off of the resist from the substrate such that the mask can be easily separated from the resist.

After completion of the near-field exposure, post exposure heating is carried out. It may be done at a temperature of 80-200° C., preferably, at 80-150° C. The post exposure bake can be made by using heating means such as a hot plate, a hot air dryer, etc.

The resist layer having been exposed by near-field exposure is developed subsequently by using an alkali aqueous solution, a water-based developing agent or an organic solvent, for example. The developing method may be dipping method, spray method, blushing method, slapping method, etc.

Here, if the aspect of the resist pattern formed through the near-field exposure should be improved by the dual-layer resist method, oxygen plasma etching may be done while using the pattern as a mask. As regards an oxygen containing gas to be used for the oxygen plasma etching, usable examples are oxygen itself, a mixed gas of oxygen and an inactive gas such as argon, for example, and a mixed gas of oxygen and carbon monoxide, carbon dioxide, ammonia, dinitrogen monoxide, or sulfur dioxide, etc.

On the other hand, if the aspect of the resist pattern formed through the near-field exposure should be improved by the triple-layer resist method, etching of the oxygen-plasma-etching resistance layer may be done while using the resist pattern as a mask. Although the etching may be either wet etching or dry etching, dry etching is preferable because it is more suitable to formation of a fine pattern.

As regards wet etching agent, usable examples are hydrofluoric acid aqueous solution, ammonium fluoride aqueous solution, phosphoric acid aqueous solution, acetic acid aqueous solution, nitric acid aqueous solution, cerium nitrate ammonium-aqueous solution, etc., and they can be used in accordance with the object of etching.

As regards dry etching gas, usable examples are $CHF_3$, $CF_4$, $C_2F_6$, $CF_6$, $CCl_4$, $BCl_3$, $Cl_2$, $HCl$, $H_2$, $Ar$, etc. These gases may be used in combination as required.

After etching the oxygen-plasma-etching resistance layer in this manner, like the dual-layer resist method, the oxygen plasma etching is carried out and a pattern is transferred to the underlying resist layer.

By using the resist pattern formed in the manner described above as a mask, one of dry etching, wet etching, metal vapor deposition, lift-off and plating may be performed, whereby the substrate can be processed.

In accordance with the substrate processing method such as described above, various specific devices can be produced. Examples are as follows:

(1) a semiconductor device;

(2) a quantum dot laser device where the method is used for production of a structure in which GaAs quantum dots of 50 nm size are arrayed two-dimensionally at 50 nm intervals;

(3) a sub wavelength element (SWS) structure having anti-reflection function where the method is used for production of a structure in which conical $SiO_2$ structures of 50 nm size are arrayed two-dimensionally at 50 nm intervals on a $SiO_2$ substrate;

(4) a photonic crystal optics device or plasmon optical device where the method is used for production of a structure in which structures of 100 nm size, made of GaN or metal, are arrayed two-dimensionally and periodically at 100 nm intervals;

(5) a biosensor or a micro-total analyzer system (µTAS) based on local plasmon resonance (LPR) or surface enhancement Raman spectrum (SERS) where the method is used for production of a structure in which Au fine particles of 50 nm size are arrayed two-dimensionally upon a plastic substrate at 50 nm intervals; and (6) a nano-electromechanical system (NEMS) device such as SPM probe, for example, where the method is used for production of a radical structure of 50 nm size or under, to be used in a scanning probe microscope (SPM) such as a near-field optical microscope, an atomic force microscope, and a tunnel microscope, and the like.

While the invention has been described with reference to the structures disclosed herein, it is not confined to the details set forth and this application is intended to cover such modifications or changes as may come within the purposes of the improvements or the scope of the following claims.

The invention claimed is:

1. A near-field exposure mask having a light blocking layer formed on a substrate, the light blocking layer having an opening with an opening width narrower than a wavelength of an exposure light source, wherein exposure of an object to be exposed is carried out by use of near-field light to be produced at the opening while the exposure mask and the object to be exposed are placed in contact with each other, and wherein the light blocking layer is provided by an amorphous film that contains silicon in a range from 50% to 100% in terms of mole fraction.

2. A near-field exposure mask according to claim 1, wherein the light blocking layer has a transmittance of 0.1 or less with respect to the wavelength of the exposure light source.

3. A near-field exposure mask according to claim 2, wherein the light blocking layer has a transmittance of 0.01 or less with respect to the wavelength of the exposure light source.

4. A near-field exposure mask according to claim 1, wherein the light blocking layer has a surface to which a fluorine-based silane coupling agent has been applied.

5. A method of producing a near-field exposure mask for exposure to be carried out by use of near-field light while the exposure mask and an object to be exposed are placed in contact with each other, comprising:

a step of forming, on a substrate, a light blocking layer by use of an amorphous film that contains silicon in a range from 50% to 100% in terms of mole fraction; and a step of forming, in the light blocking layer, an opening with an opening width narrower than a wavelength of an exposure light source.

6. A near-field exposure apparatus comprising:
a light source;
a near-field exposure mask with a light blocking layer; and
means for contacting the light blocking layer of the mask with an object to be exposed,
wherein light is projected from a side remote from the light blocking layer of the exposure mask while the light blocking layer and the object to be exposed are placed in contact with each other so that exposure of the object to be exposed is carried out by use of near-field light produced at the exposure object side, and
wherein the near-field exposure mask has a light blocking layer having an opening with an opening width narrower than a wavelength of said light source, and
wherein the light blocking layer is provided by an amorphous film that contains silicon in a range from 50% to 100% in terms of mole fraction.

7. A resist pattern forming method in which a near-field exposure mask having a light blocking layer with an opening is used, comprising:
carrying out exposure while the mask is placed in contact with a resist, to thereby produce a pattern based on the opening in the resist,
wherein, as the near-field exposure mask, a mask having a light blocking layer formed on a substrate and having an opening with an opening width narrower than a wavelength of an exposure light source, is used, and
wherein the light blocking layer is provided by an amorphous film that contains silicon in a range from 50% to 100% in terms of mole fraction.

8. A resist pattern forming method according to claim 7, wherein, as the exposure light source, light of a wavelength of 365 nm or less is used.

9. A resist pattern forming method according to claim 7, wherein the resist is a chemical amplification type resist.

10. A resist pattern forming method according to claim 7, wherein the resist is an optical cationic polymerization type resist.

11. A device manufacturing method comprising:
a step of applying a photosensitive resist to a substrate for device manufacture;
a step of bringing the resist and a near-field exposure mask into contact with each other;
a step of irradiating the resist with light from an exposure light source through the near-field exposure mask;
a step of developing the resist after being irradiated with the light; and
a step of etching the substrate on the basis of the resist after being developed, wherein, as the near-field exposure mask, a mask having a light blocking layer formed on a substrate for the mask and having an opening with an opening width narrower than a wavelength of an exposure light source, is used, and
wherein the light blocking layer is provided by an amorphous film that contains silicon in a range from 50% to 100% in terms of mole fraction.

* * * * *